US012108371B2

(12) United States Patent
Ryu et al.

(10) Patent No.: US 12,108,371 B2
(45) Date of Patent: Oct. 1, 2024

(54) SIDELINK SLOTS WITHOUT SYMBOLS FOR AUTOMATIC GAIN CONTROL

(71) Applicant: QUALCOMM Incorporated, San Diego, CA (US)

(72) Inventors: Jung Ho Ryu, Fort Lee, NJ (US); Junyi Li, Fairless Hills, PA (US); Sony Akkarakaran, Poway, CA (US); Tao Luo, San Diego, CA (US); Wooseok Nam, San Diego, CA (US); Xiaojie Wang, Hillsborough, NJ (US); Yan Zhou, San Diego, CA (US); Peter Gaal, San Diego, CA (US); Juan Montojo, San Diego, CA (US); Xiaoxia Zhang, San Diego, CA (US); Hua Wang, Basking Ridge, NJ (US); Piyush Gupta, Bridgewater, NJ (US); Kobi Ravid, Closter, NJ (US); Chih-Hao Liu, San Diego, CA (US); Lik Hang Silas Fong, Bridgewater, NJ (US); Jing Sun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 311 days.

(21) Appl. No.: 17/647,724

(22) Filed: Jan. 11, 2022

(65) Prior Publication Data

US 2023/0224873 A1 Jul. 13, 2023

(51) Int. Cl.
*H04W 72/0446* (2023.01)
*H04L 27/26* (2006.01)
*H04W 52/52* (2009.01)

(52) U.S. Cl.
CPC ..... *H04W 72/0446* (2013.01); *H04L 27/2607* (2013.01); *H04W 52/52* (2013.01)

(58) Field of Classification Search
CPC ............ H03G 2201/202; H03G 3/002; H03G 3/3052; H04B 1/1027; H04L 27/2607;
(Continued)

(56) References Cited

U.S. PATENT DOCUMENTS

2008/0130801 A1* 6/2008 Wang .................... H03G 3/3036
375/345
2009/0268678 A1* 10/2009 Huo ....................... H04W 52/52
370/329
(Continued)

FOREIGN PATENT DOCUMENTS

| WO | 2015042789 A1 | 4/2015 |
|----|---------------|--------|
| WO | 2020069441 A1 | 4/2020 |
| WO | 2021217484 A1 | 11/2021 |

OTHER PUBLICATIONS

International Search Report and Written Opinion—PCT/US2023/060247—ISA/EPO—Jul. 11, 2023.
(Continued)

*Primary Examiner* — Nguyen T Vo
(74) *Attorney, Agent, or Firm* — Patterson + Sheridan, LLP

(57) ABSTRACT

Certain aspects of the present disclosure provide techniques for configuring sidelink slots without symbols for automatic gain control. One aspect provides a method for wireless communication by a user equipment, including receiving a first cyclic prefix of a first symbol within a slot at the user equipment. The method further includes configuring a first automatic gain control setting based on a received power in the first cyclic prefix of the first symbol, and receiving a data portion of the first symbol using the first automatic gain control setting.

30 Claims, 8 Drawing Sheets

(58) Field of Classification Search
CPC .. H04W 52/52; H04W 72/0446; H04W 92/18
See application file for complete search history.

(56) References Cited

U.S. PATENT DOCUMENTS

| | | | |
|---|---|---|---|
| 2009/0310690 A1* | 12/2009 | Lee | H03G 3/3078 |
| | | | 375/345 |
| 2010/0189188 A1* | 7/2010 | Li | H04L 27/2647 |
| | | | 375/317 |
| 2017/0251439 A1* | 8/2017 | Liu | H04L 27/2607 |
| 2018/0248610 A1* | 8/2018 | Faerber | H04B 7/086 |
| 2020/0275458 A1* | 8/2020 | Khoryaev | H04W 72/12 |
| 2020/0288419 A1* | 9/2020 | Gao | H04W 4/46 |

OTHER PUBLICATIONS

Partial International Search Report—PCT/US2023/060247—ISA/EPO—May 15, 2023.

\* cited by examiner

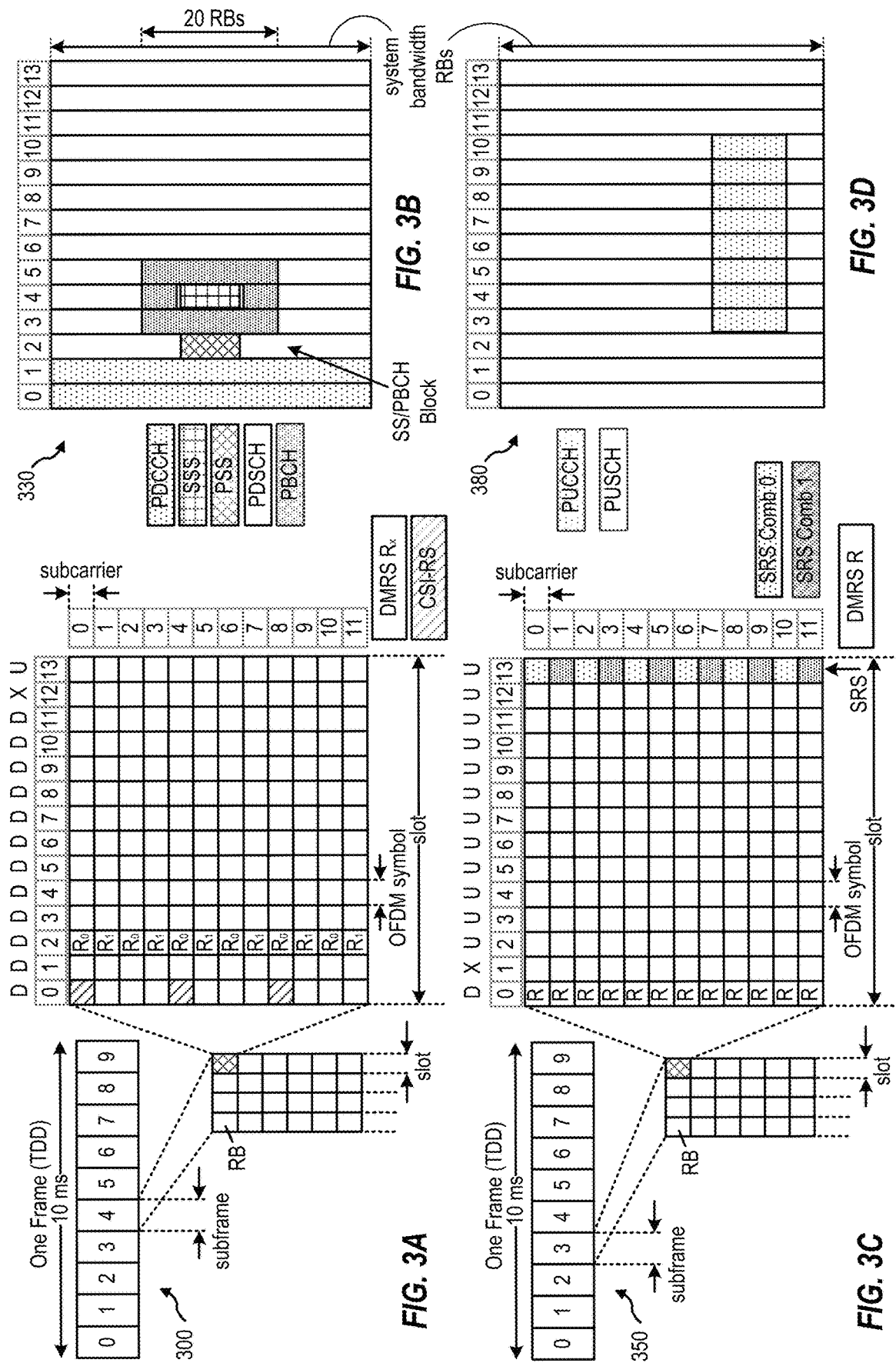

SIDELINK SLOTS WITHOUT SYMBOLS FOR AUTOMATIC GAIN CONTROL

INTRODUCTION

Aspects of the present disclosure relate to wireless communications, and more particularly, to techniques for configuring sidelink slots without symbols for automatic gain control.

Wireless communication systems are widely deployed to provide various telecommunication services such as telephony, video, data, messaging, broadcasts, or other similar types of services. These wireless communication systems may employ multiple-access technologies capable of supporting communication with multiple users by sharing available system resources with those users (e.g., bandwidth, transmit power, or other resources). Multiple-access technologies can rely on any of code division, time division, frequency division orthogonal frequency division, single-carrier frequency division, or time division synchronous code division, to name a few. These and other multiple access technologies have been adopted in various telecommunication standards to provide a common protocol that enables different wireless devices to communicate on a municipal, national, regional, and even global level.

Although wireless communication systems have made great technological advancements over many years, challenges still exist. For example, complex and dynamic environments can still attenuate or block signals between wireless transmitters and wireless receivers, undermining various established wireless channel measuring and reporting mechanisms, which are used to manage and optimize the use of finite wireless channel resources. Consequently, there exists a need for further improvements in wireless communications systems to overcome various challenges.

SUMMARY

One aspect provides a method for wireless communication by a user equipment, including receiving a first cyclic prefix of a first symbol within a slot at the user equipment; configuring a first automatic gain control setting based on a received power in the first cyclic prefix of the first symbol; and receiving a data portion of the first symbol using the first automatic gain control setting.

One aspect provides a method for wireless communication by a user equipment, including transmitting a plurality of symbols within a sidelink slot, wherein a physical sidelink shared channel (PSSCH) resource allocation for the sidelink slot begins with a first symbol of the sidelink slot.

Other aspects provide: an apparatus operable, configured, or otherwise adapted to perform the aforementioned methods as well as those described elsewhere herein; a non-transitory, computer-readable media comprising instructions that, when executed by one or more processors of an apparatus, cause the apparatus to perform the aforementioned methods as well as those described elsewhere herein; a computer program product embodied on a computer-readable storage medium comprising code for performing the aforementioned methods as well as those described elsewhere herein; and an apparatus comprising means for performing the aforementioned methods as well as those described elsewhere herein. By way of example, an apparatus may comprise a processing system, a device with a processing system, or processing systems cooperating over one or more networks.

The following description and the appended figures set forth certain features for purposes of illustration.

BRIEF DESCRIPTION OF THE DRAWINGS

The appended figures depict certain features of the various aspects described herein and are not to be considered limiting of the scope of this disclosure.

FIGS. 3A, 3B, 3C, and 3D depict various aspects of data structures for a wireless communication network.

DETAILED DESCRIPTION

Figure 1:
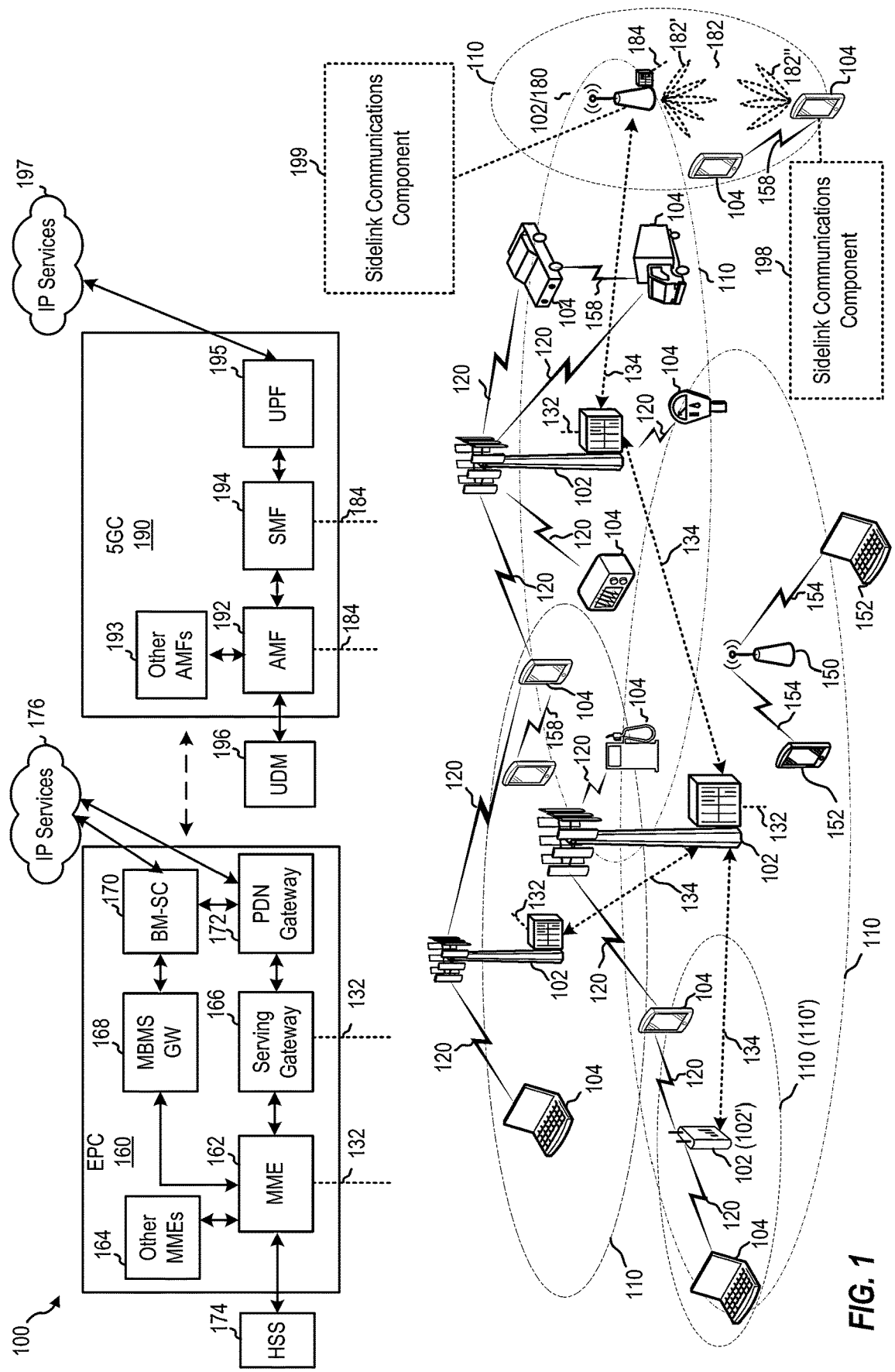
FIG. 1 is a block diagram conceptually illustrating an example wireless communication network.

Aspects of the present disclosure provide apparatuses, methods, processing systems, and computer-readable mediums for configuring sidelink slots without symbols for automatic gain control.

In wireless communication systems, automatic gain control (AGC) algorithms are used by user equipments receiving wireless signals in order to regulate the signal strength at the input of signal processing elements, such as analog to digital converters (ADCs). This regulation helps to ensure that the required signal-to-noise ratio (SNR) for proper decoding of the received wireless signal is met. For example, if a received signal strength at an antenna is low, an AGC algorithm may boost the receiver gain in order to bring the signal level to an acceptable (SNR) and to avoid ADC "underflow". Likewise, if the received signal strength is high, the AGC algorithm may attenuate the receiver gain in order to avoid signal clipping (e.g., ADC "overflow") and nonlinear degradations that may deteriorate the SNR. In other words, AGC algorithms help to ensure that received signals lie within operating ranges of a user equipment's receiving hardware (e.g. ADCs).

Generally, a slot format for wireless communication may include a symbol that is used for AGC. For example, a first symbol in a slot may be designated as an "AGC symbol" in order that a receiving user equipment knows to measure that symbol and provide the received signal strength for that designated symbol to an AGC algorithm (or module). Designating a symbol within a slot for AGC naturally comes at the cost of spectrum efficiency and wireless data throughput since that AGC symbol cannot be used for data transmission and reception. This inefficiency is compounded when mini-slot formats are used by user equipments, such as in the context of sidelink communications between user equipments. In such cases, each mini-slot within a slot may begin with a symbol designated for AGC use, in which case a single slot (e.g., with 14 OFDM symbols) may contain multiple symbols designated for AGC use, thereby reducing the data carrying capacity of the slot even more significantly compared to the standard slot-based context.

Aspects described herein overcome these technical limitations of existing AGC procedures by using a cyclic prefix for a symbol to measure received signal power, rather than the entire symbol itself. In this way, a symbol may be used to transmit data and to set AGC. Many efficiencies are realized by such aspects. For example, in the sidelink context, a physical sidelink shared channel (PSSCH) communication can begin in a first symbol of a slot (or mini-slot) instead of the second symbol, because the first symbol need not be reserved for AGC use. Similarly, a physical sidelink feedback channel (PSFCH) communication can occupy a single symbol instead of two symbols as in conventional implementations. Thus, the overall data carrying capacity of any slot or mini-slot using a cyclic prefix for AGC rather than an entire symbol is beneficially improved. Relatedly, the spectrum efficiency and data throughput of the wireless communication system are improved, which can reduce latency in communications and reduce power use by both transmitting and receiving network entities (e.g., user equipments). Thus, the performance of wireless communications is generally improved by using cyclic prefixes for AGC, as described in more detail with respect to various aspects herein.

Introduction to Wireless Communication Networks

FIG. 1 depicts an example of a wireless communication network 100, in which aspects described herein may be implemented.

Generally, wireless communication network 100 includes base stations (BSs) 102, user equipments (UEs) 104, one or more core networks, such as an Evolved Packet Core (EPC) 160 and 5G Core (5GC) network 190, which interoperate to provide wireless communications services.

BSs 102 may provide an access point to the EPC 160 and/or 5GC 190 for a UE 104, and may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, delivery of warning messages, among other functions. Base stations may include and/or be referred to as a gNB, NodeB, eNB, ng-eNB (e.g., an eNB that has been enhanced to provide connection to both EPC 160 and 5GC 190), an access point, a base transceiver station, a radio base station, a radio transceiver, or a transceiver function, or a transmission reception point in various contexts.

A base station, such as BS 102, may include components that are located at a single physical location or components located at various physical locations. In examples in which the base station includes components that are located at various physical locations, the various components may each perform various functions such that, collectively, the various components achieve functionality that is similar to a base station that is located at a single physical location. As such, a base station may equivalently refer to a standalone base station or a base station including components that are located at various physical locations or virtualized locations. In some implementations, a base station including components that are located at various physical locations may be referred to as or may be associated with a disaggregated radio access network (RAN) architecture, such as an Open RAN (O-RAN) or Virtualized RAN (VRAN) architecture. In some implementations, such components of a base station may include or refer to one or more of a central unit (CU), a distributed unit (DU), or a radio unit (RU).

BSs 102 wirelessly communicate with UEs 104 via communications links 120. Each of BSs 102 may provide communication coverage for a respective geographic coverage area 110, which may overlap in some cases. For example, small cell 102' (e.g., a low-power base station) may have a coverage area 110' that overlaps the coverage area 110 of one or more macrocells (e.g., high-power base stations).

The communication links 120 between BSs 102 and UEs 104 may include uplink (UL) (also referred to as reverse link) transmissions from a UE 104 to a BS 102 and/or downlink (DL) (also referred to as forward link) transmissions from a BS 102 to a UE 104. The communication links 120 may use multiple-input and multiple-output (MIMO) antenna technology, including spatial multiplexing, beamforming, and/or transmit diversity in various aspects.

Examples of UEs 104 include a cellular phone, a smart phone, a session initiation protocol (SIP) phone, a laptop, a personal digital assistant (PDA), a satellite radio, a global positioning system, a multimedia device, a video device, a digital audio player, a camera, a game console, a tablet, a smart device, a wearable device, a vehicle, an electric meter, a gas pump, a large or small kitchen appliance, a healthcare device, an implant, a sensor/actuator, a display, or other similar devices. Some of UEs 104 may be internet of things (IoT) devices (e.g., parking meter, gas pump, toaster, vehicles, heart monitor, or other IoT devices), always on (AON) devices, or edge processing devices. UEs 104 may also be referred to more generally as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, or a client.

Communications using higher frequency bands may have higher path loss and a shorter range compared to lower frequency communications. Accordingly, certain base stations (e.g., 180 in FIG. 1) may utilize beamforming 182 with a UE 104 to improve path loss and range. For example, base station 180 and the UE 104 may each include a plurality of antennas, such as antenna elements, antenna panels, and/or antenna arrays to facilitate the beamforming.

In some cases, base station 180 may transmit a beamformed signal to UE 104 in one or more transmit directions 182'. UE 104 may receive the beamformed signal from the base station 180 in one or more receive directions 182". UE 104 may also transmit a beamformed signal to the base station 180 in one or more transmit directions 182". Base station 180 may also receive the beamformed signal from UE 104 in one or more receive directions 182'. Base station 180 and UE 104 may then perform beam training to determine the best receive and transmit directions for each of base station 180 and UE 104. Notably, the transmit and receive directions for base station 180 may or may not be the same. Similarly, the transmit and receive directions for UE 104 may or may not be the same.

Wireless communication network 100 includes sidelink communications component 199, which may be configured to configure sidelink slots without automatic gain control symbols. Wireless communication network 100 further includes sidelink communications component 198, which may be used to perform sidelink communications with one or more other user equipment.

Figure 2:
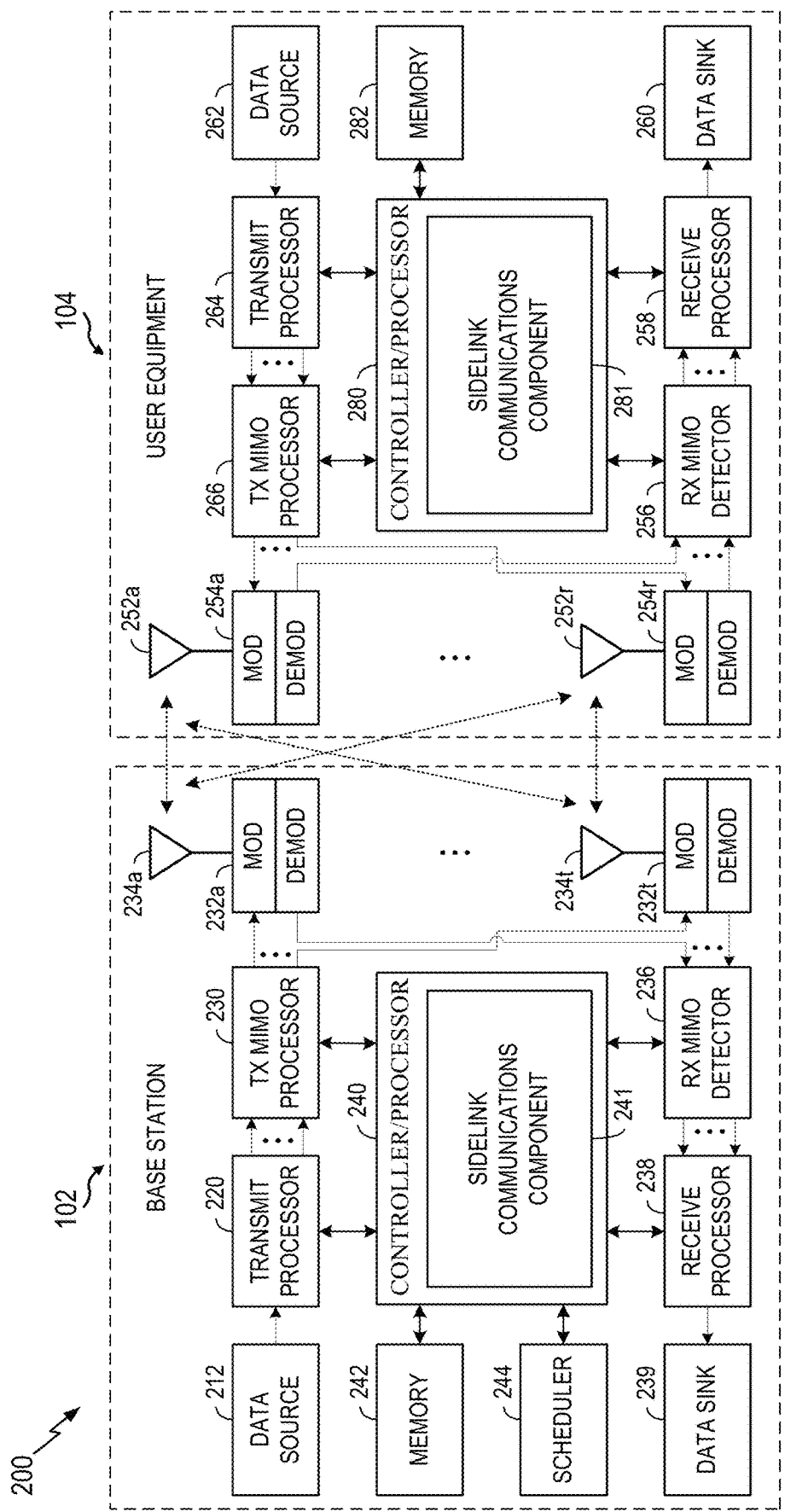
FIG. 2 is a block diagram conceptually illustrating aspects of an example of a base station and user equipment.

FIG. 2 depicts aspects of an example BS 102 and a UE 104. Generally, BS 102 includes various processors (e.g., 220, 230, 238, and 240), antennas 234a-t (collectively 234), transceivers 232a-t (collectively 232), which include modulators and demodulators, and other aspects, which enable wireless transmission of data (e.g., data source 212) and wireless reception of data (e.g., data sink 239). For example, BS 102 may send and receive data between itself and UE 104.

BS 102 includes controller/processor 240, which may be configured to implement various functions related to wireless communications. In the depicted example, controller/processor 240 includes sidelink communications component 241, which may be representative of sidelink communications component 199 of FIG. 1. Notably, while depicted as an aspect of controller/processor 240, sidelink communications component 241 may be implemented additionally or alternatively in various other aspects of BS 102 in other implementations.

Generally, UE 104 includes various processors (e.g., 258, 264, 266, and 280), antennas 252a-r (collectively 252), transceivers 254a-r (collectively 254), which include modulators and demodulators, and other aspects, which enable wireless transmission of data (e.g., data source 262) and wireless reception of data (e.g., data sink 260).

UE 104 includes controller/processor 280, which may be configured to implement various functions related to wireless communications. In the depicted example, controller/processor 280 includes sidelink communications component 281, which may be representative of sidelink communications component 198 of FIG. 1. Notably, while depicted as an aspect of controller/processor 280, sidelink communications component 281 may be implemented additionally or alternatively in various other aspects of UE 104 in other implementations.

FIGS. 3A, 3B, 3C, and 3D depict aspects of data structures for a wireless communication network, such as wireless communication network 100 of FIG. 1. In particular, FIG. 3A is a diagram 300 illustrating an example of a first subframe within a 5G (e.g., 5G NR) frame structure, FIG. 3B is a diagram 330 illustrating an example of DL channels within a 5G subframe, FIG. 3C is a diagram 350 illustrating an example of a second subframe within a 5G frame structure, and FIG. 3D is a diagram 380 illustrating an example of UL channels within a 5G subframe.

Further discussions regarding FIG. 1, FIG. 2, and FIGS. 3A, 3B, 3C, and 3D are provided later in this disclosure.

Introduction to Sidelink Slot Structures

Some wireless communication systems allow user equipment (UEs) to communicate directly with each over sidelink communications, for example, base station to base station or user equipment to user equipment. For example, one UE participating in sidelink communications may be referred to as the transmitting (Tx) UE and another may be referred to as the receiving (Rx) UE.

In a typical sidelink slot structure, an initial/first symbol in time (e.g., symbol 0 for a zero-indexed slot) may be used by the UE to transmit a symbol dedicated for AGC. Mini-slots are structured similarly to the typical sidelink slot structure, but with shorter lengths. For example, a mini-slot may be 3, 4, 5, 6 or 7 OFDM symbols in length. Mini-slots may likewise include an initial symbol designated for AGC followed by one or more symbols for PSCCH and PSSCH signals. A slot containing multiple mini-slots will generally include a gap symbol separating the mini-slots.

Although the term "slot" is frequently used to describe the time-domain resources of a sidelink transmission, it can be appreciated that any other suitable time window may be used with, or as an alternative, according to the features of this disclosure.

Figure 4A:
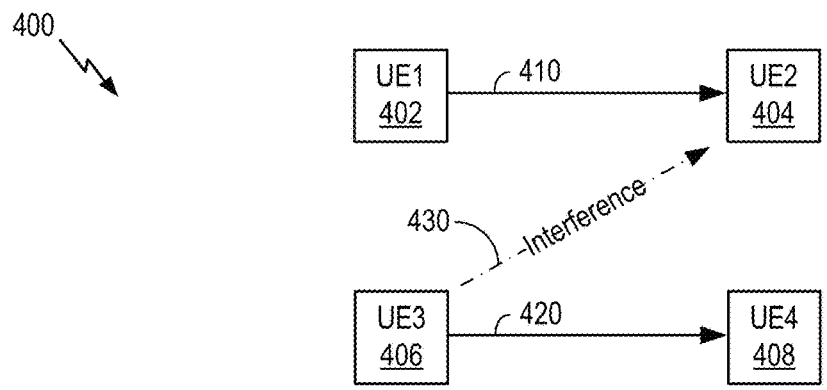
FIGS. 4A, 4B, and 4C depict aspects of automatic gain control in sidelink communications between user equipments.
Figure 4B:
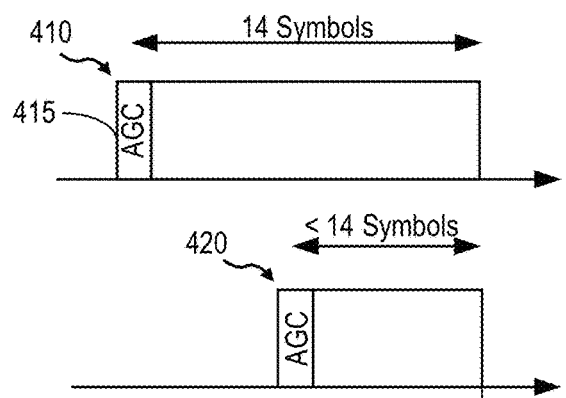
Figure 4C:
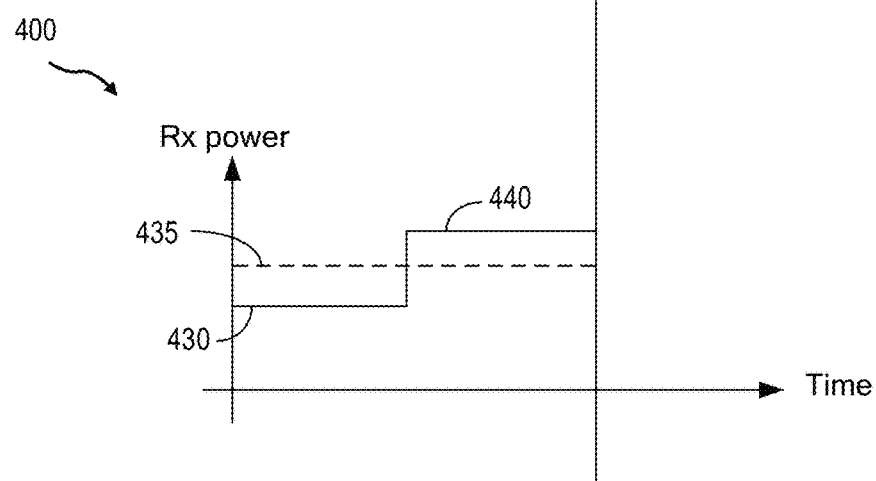

Aspects Related to Sidelink Communications with Symbols Designated for Automatic Gain Control FIGS. 4A, 4B, and 4C depict aspects of automatic gain control in sidelink communications 400 between user equipments.

In FIG. 4A, a first UE 402 transmits a first sidelink communication 410 (using a slot structure depicted in FIG. 4B) to a second UE 404. Simultaneously, a third UE 406 transmits a second sidelink communication 420 (using a mini-slot structure depicted in FIG. 4B) to a fourth UE 408. While the second UE 404 is not the intended recipient of the second sidelink communication 420, the second UE 404 may nevertheless receive the second sidelink communication 420 as interference 430 while attempting to receive the first sidelink communication 410.

FIG. 4C depicts the received power from the perspective of the second UE 404 in FIG. 4A. Notably, in the middle of the slot, the interference 430 created by sidelink communication 420 increases the received power from an initial level 430 to a second, higher level 440. Assuming that the second UE 404 set its automatic gain control to a level 435 based on the received power level 430 (e.g., based on receiving symbol 415 designated for AGC as depicted in FIG. 4B), then the increase in received power to level 440 may cause signal reception issues, such as ADC overflow because the gain necessary for received power level 430 is different than that of received power level 440, but the gain level 435 does not change during the slot. This happens because conventionally a user equipment sets its AGC level for the duration of a sidelink slot, which may be defined in some cases by a sidelink start symbol parameter and a sidelink symbol length parameter. Thus, it is apparent that configuring gain via AGC may be negatively affected by signals received by a user equipment that are not intended for that user equipment, such as in the case of second UE 404 receiving interference 430.

Moreover, it is clear that in both the case of the slot-based communication 410 and the mini-slot-based communication 420, some portion of the slot/mini-slot (e.g., at least one symbol in each) is used specifically for AGC and not for data transmission, thus leading to less efficient use of the wireless spectrum.

Accordingly, aspects herein provide techniques for performing automatic gain control without dedicated AGC symbols, and in particular by using a symbol's cyclic prefix for setting gain. As described in more detail below, these aspects may improve upon both of the aforementioned technical problems. Namely, performing AGC without the need for dedicated symbols improves communication efficiency by reclaiming such symbols for data transmission. Moreover, performing AGC based on a symbol's cyclic prefix allows for adjusting gain multiple times throughout a slot or mini-slot, e.g., during each symbol's (or some subset of symbols') cyclic prefix, rather than only at the beginning of the slot or mini-slot, which prevents unpredictable interference from causing sub-optimal gain control.

Aspects Related to Configuring Automatic Gain Control Based on Cyclic Prefixes

Figure 5A:
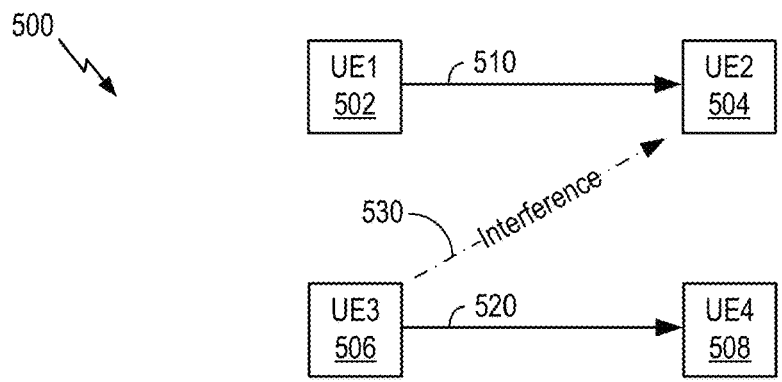
FIGS. 5A, 5B, and 5C depict aspects of automatic gain control using cyclic prefixes in sidelink communications between user equipments.
Figure 5B:
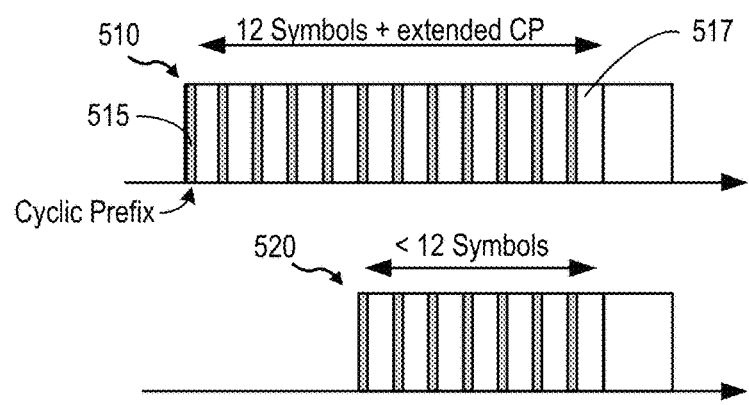
Figure 5C:
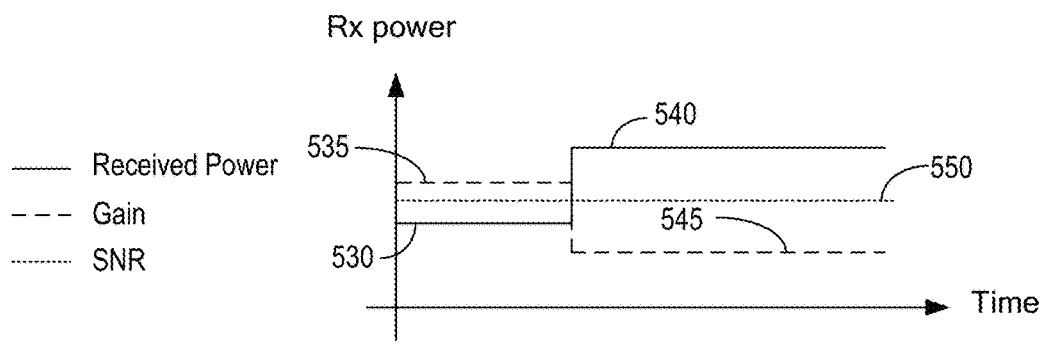

FIGS. 5A, 5B, and 5C depict aspects of automatic gain control using cyclic prefixes in sidelink communications 500 between user equipments.

As in the example of FIG. 4A, here in FIG. 5A, a first UE 502 transmits a first sidelink communication 510 (using a slot structure depicted in FIG. 5B) to a second UE 504. Simultaneously, a third UE 506 transmits a second sidelink communication 520 (using a mini-slot structure depicted in FIG. 5B) to a fourth UE 508. While the second UE 504 is not the intended recipient of the second sidelink communication 520, the second UE 504 nevertheless receives the second sidelink communication 520 as interference 530 while attempting to receive the first sidelink communication 510.

FIG. 5C depicts the received power from the perspective of the second UE 504 in FIG. 5A. As in the example of FIG. 4C, in the middle of the slot, the interference 530 created by sidelink communication 520 increases the received power from the initial level 530 to a second, higher level 540. However, in this example, because the second UE 504 is adjusting AGC based on cyclic prefixes (e.g., 515) associated with each symbol, it senses the increased received signal power from interference 530 and therefore adjusts its AGC from a first level 535 to a second level 545, which in this case is lower due to the increased received power. Note that in an opposite scenario, such as where the received signal decreased, then the second UE 504 may increase its AGC setting to a higher level (e.g., perform the converse operation).

Notably, a UE may be configured to adjust its AGC for every cyclic prefix, or some subset of cyclic prefixes received during a slot or mini-slot. For example, a UE could choose to adjust AGC every other cyclic prefix, or every n number of cyclic prefixes. In some aspects, the choice of slot format may be determined in part based on the settling time necessary for the AGC function. For example, for 120 KHz subcarrier spacing (SCS), the cyclic prefix duration is approximately 0.6 µs, whereas for 60 KHz SCS, the cyclic prefix duration=1.17 µs, or 4.17 µs for extended cyclic prefix configurations. Thus, for example, user equipment performing sidelink communications may elect to use 60 KHz sidelink SCS and extended CP to allow more time for AGC to set gain and settle. In some aspects, the sidelink SCS may be configured is a sidelink bandwidth part (BWP) parameter so that all resource pools use the same sidelink SCS.

In the example depicted in FIG. 5B, a slot format with extended cyclic prefixes is depicted, such that the overall slot includes twelve data symbols. In this example, one symbol is a gap 517. However, in other examples, dense slot formats (e.g., with 14 symbols) may likewise be used.

Beneficially, as compared to the example in FIGS. 4A-4C, here all of the symbols are usable for data transmission, thus leading to efficient use of the communication resources. This may lead to reduced communication latency, more efficient use of the spectrum, lower power use, and other benefits. Further, because AGC is determined more accurately, SNR and communication reliability may be improved, which leads to reduced needs for retransmission, lower latency, and more efficient power use.

Example Methods

Figure 6:
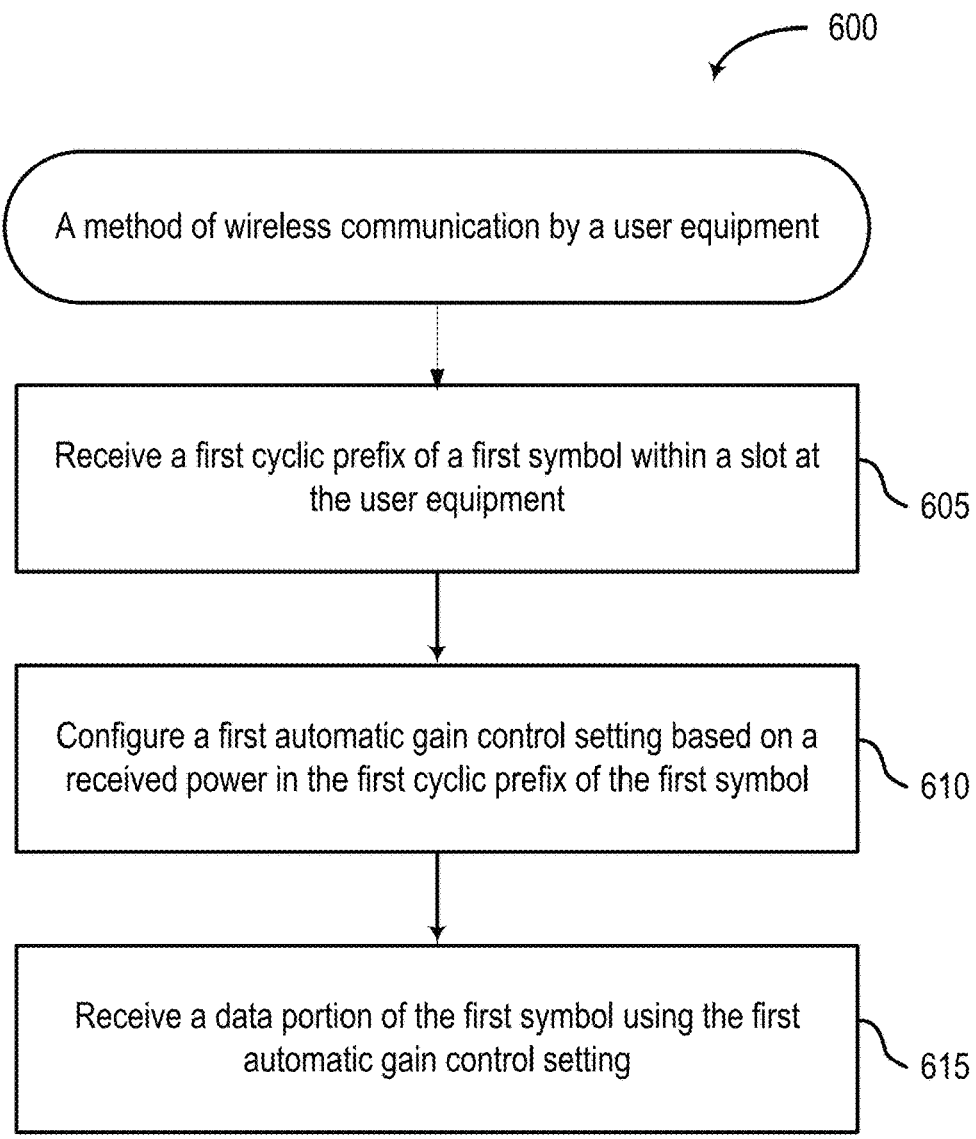
FIG. 6 depicts an example process for wireless communication according to aspects of the present disclosure.

FIG. 6 shows an example of a method 600 for wireless communication according to aspects of the present disclosure. In some aspects, a user equipment, such as UE 104 of FIGS. 1 and 2, or processing system 805 of FIG. 8, may perform the method 600.

Method 600 begins at step 605 with receiving a first cyclic prefix of a first symbol within a slot at the user equipment. In some cases, the operations of this step refer to, or may be performed by, cyclic prefix reception circuitry as described with reference to FIG. 8.

Method 600 then proceeds to step 610 with configuring a first automatic gain control setting based on a received power in the first cyclic prefix of the first symbol. In some cases, the operations of this step refer to, or may be performed by, AGC configuration circuitry as described with reference to FIG. 8.

Method 600 then proceeds to step 615 with receiving a data portion of the first symbol using the first automatic gain control setting. In some cases, the operations of this step refer to, or may be performed by, data reception circuitry as described with reference to FIG. 8.

In some aspects, the method 600 further includes receiving a second cyclic prefix of a second symbol within the slot at the user equipment, configuring a second automatic gain control setting based on a received power in the second cyclic prefix of the second symbol, and receiving a data portion of the second symbol using the second automatic gain control setting.

In some aspects, the first symbol is the first symbol of the slot. In some aspects, the first symbol comprises a physical sidelink shared channel (PSSCH) symbol.

In some aspects, the first symbol comprises a physical sidelink feedback channel (PSFCH) symbol and the slot comprises only one PSFCH symbol (e.g., among other symbols within the slot).

In some aspects, the method 600 further includes transmitting an indication that the user equipment is configured to adjust an automatic gain control setting based on a received power in a cyclic prefix.

In some aspects, the first cyclic prefix is an extended cyclic prefix. In some aspects, the method 600 further includes enabling the extended cyclic prefix in order to configure the first automatic gain control setting based on the received power in the first cyclic prefix of the first symbol. In some aspects, the slot comprises twelve symbols.

In some aspects, the method 600 further includes configuring the first automatic gain control setting without receiving a symbol configured for use in automatic gain control within the slot.

Figure 7:
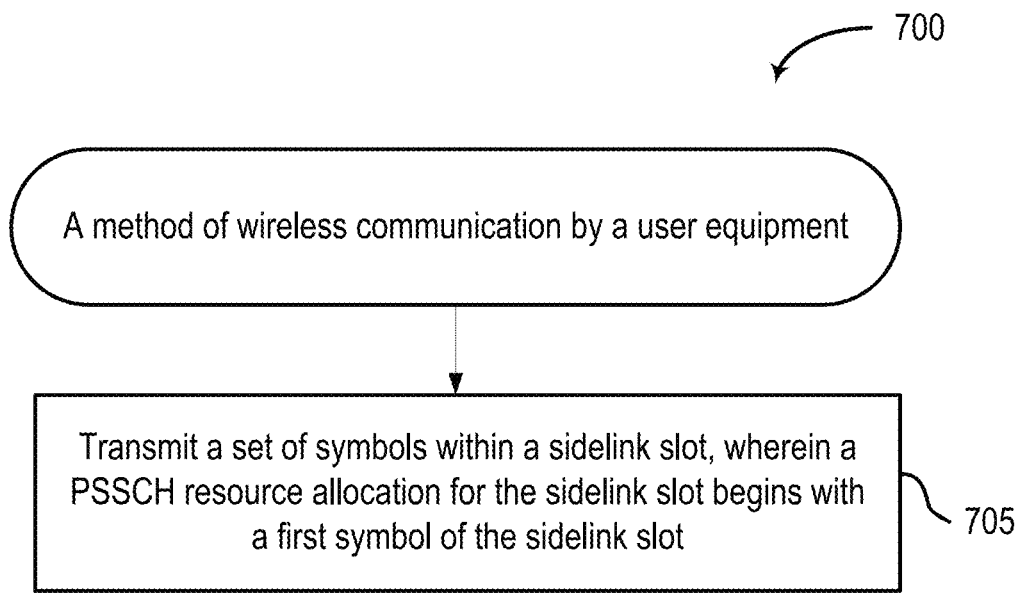
FIG. 7 depicts another example process for wireless communication according to aspects of the present disclosure.

FIG. 7 shows an example of a method 700 for wireless communication according to aspects of the present disclosure. In some aspects, a user equipment, such as UE 104 of FIGS. 1 and 2, or processing system 805 of FIG. 8, may perform the method 700.

Method 700 begins at step 705 with transmitting a set of symbols within a sidelink slot, where a PSSCH resource allocation for the sidelink slot begins with a first symbol of the sidelink slot. In some cases, the operations of this step refer to, or may be performed by, sidelink transmission circuitry as described with reference to FIG. 8.

In some aspects, the first symbol of the sidelink slot and a second symbol of the sidelink slot comprise different data. In some aspects, the first symbol of the sidelink slot comprises PSSCH data and physical sidelink control channel data. In some aspects, the sidelink slot is configured by a starting symbol parameter indicating that the first symbol comprises sidelink data. In some aspects, the starting symbol parameter is a startSLsymbols parameter.

Example Wireless Communication Device

Figure 8:
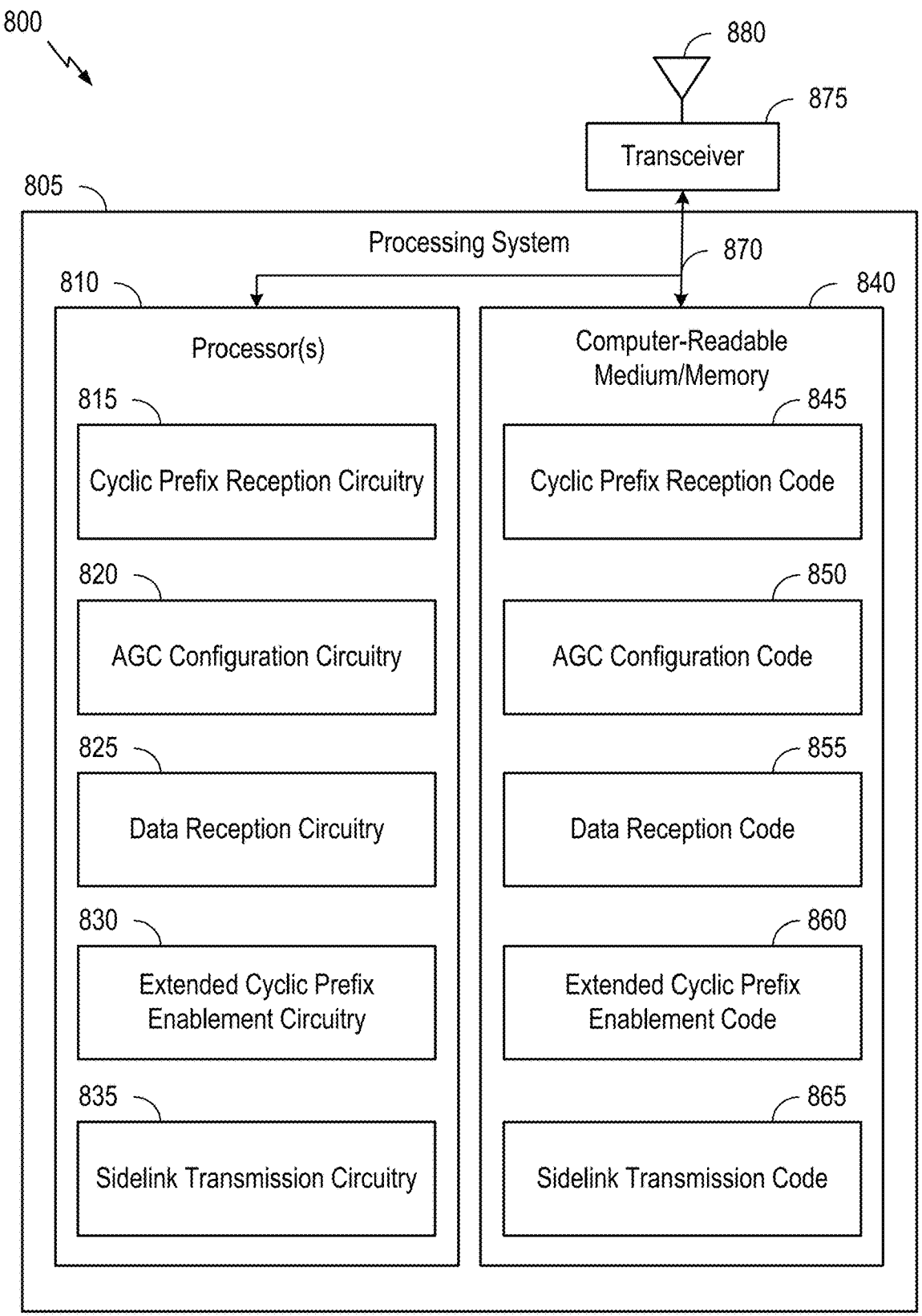
FIG. 8 depicts an example communication device according to aspects of the present disclosure.

FIG. 8 depicts an example communications device 800 that includes various components operable, configured, or adapted to perform operations for the techniques disclosed herein, such as the operations depicted and described with respect to FIGS. 6-7. In some examples, communication device 800 may be a UE 104 as described, for example with respect to FIGS. 1 and 2.

Communications device 800 includes a processing system 805 coupled to the transceiver 875 (e.g., a transmitter and/or a receiver). The transceiver 875 is configured to transmit (or send) and receive signals for the communications device 800 via the antenna 880, such as the various signals as described herein. The transceiver 875 may communicate bi-directionally, via the antennas 880, wired links, or wireless links as described herein. For example, the transceiver 875 may represent a wireless transceiver and may communicate bi-directionally with another wireless transceiver. The transceiver 875 may also include or be connected to a modem to modulate the packets and provide the modulated packets to for transmission, and to demodulate received packets. In some examples, the transceiver 875 may be tuned to operate at specified frequencies. For example, a modem can configure the transceiver 875 to operate at a specified frequency and power level based on the communication protocol used by the modem.

Processing system 805 may be configured to perform processing functions for communications device 800, including processing signals received and/or to be transmitted by communications device 800. Processing system 805 includes one or more processors 810 coupled to a computer-readable medium/memory 840 via a bus 870.

In some examples, one or more processors 810 may include one or more intelligent hardware devices, (e.g., a general-purpose processing component, a digital signal processor (DSP), a central processing unit (CPU), a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the one or more processors 810 are configured to operate a memory array using a memory controller. In other cases, a memory controller is integrated into the one or more processors 810. In some cases, the one or more processors 810 are configured to execute computer-readable instructions stored in a memory to perform various functions. In some aspects, one or more processors 810 include special purpose components for modem processing, baseband processing, digital signal processing, or transmission processing.

In certain aspects, computer-readable medium/memory 840 is configured to store instructions (e.g., computer-executable code) that when executed by the one or more processors 810, cause the one or more processors 810 to perform the operations illustrated in FIGS. 6-7, or other operations for performing the various techniques discussed herein.

In one aspect, computer-readable medium/memory 840 includes cyclic prefix reception code 845, AGC configuration code 850, data reception code 855, extended cyclic prefix enablement code 860, and sidelink transmission code 865.

Examples of a computer-readable medium/memory 840 include random access memory (RAM), read-only memory (ROM), solid state memory, a hard drive, a hard disk drive, etc. In some examples, computer-readable medium/memory 840 is used to store computer-readable, computer-executable software including instructions that, when executed, cause a processor to perform various functions described herein. In some cases, the memory contains, among other things, a basic input/output system (BIOS) which controls basic hardware or software operation such as the interaction with peripheral components or devices. In some cases, a memory controller operates memory cells. For example, the memory controller can include a row decoder, column decoder, or both. In some cases, memory cells within a memory store information in the form of a logical state.

Various components of communications device 1000 may provide means for performing the methods described herein, including with respect to FIGS. 6-7.

In some examples, means for transmitting or sending (or means for outputting for transmission) may include transceivers 254 and/or antenna(s) 252 of the UE 104 illustrated in FIG. 2 and/or the transceiver 1075 and the antenna 880 of the communication device in FIG. 8.

In some examples, means for receiving (or means for obtaining) may include transceivers 254 and/or antenna(s) 252 of the UE 104 illustrated in FIG. 2 and/or the transceiver 875 and the antenna 880 of the communication device in FIG. 8.

In some examples, means for receiving, configuring, and transmitting may include various processing system 1005 components, such as: the one or more processors 810 in FIG. 8, or aspects of the UE 104 depicted in FIG. 2, including receive processor 258, transmit processor 264, TX MIMO processor 266, and/or controller/processor 280 (including sideline communications component 281).

In one aspect, one or more processors 810 includes cyclic prefix reception circuitry 815, automatic gain control (AGC) configuration circuitry 820, data reception circuitry 825, extended cyclic prefix enablement circuitry 830, and sidelink transmission circuitry 835.

According to some aspects, cyclic prefix reception circuitry 815 receives a first cyclic prefix of a first symbol within a slot at the user equipment. In some examples, cyclic prefix reception circuitry 815 receives a second cyclic prefix of a second symbol within the slot at the user equipment. In some aspects, the first symbol is the first symbol of the slot. In some aspects, the first symbol includes a PSSCH symbol. In some aspects, the first symbol includes a PSFCH and the slot includes only one symbol for the PSFCH.

According to some aspects, AGC configuration circuitry 820 configures a first automatic gain control setting based on a received power in the first cyclic prefix of the first symbol. In some examples, AGC configuration circuitry 820 configures a second automatic gain control setting based on a received power in the second cyclic prefix of the second symbol. In some examples, AGC configuration circuitry 820 transmits an indication that the user equipment is configured to adjust an automatic gain control setting based on a received power in a cyclic prefix. In some examples, AGC configuration circuitry 820 configures the first automatic gain control setting without receiving a symbol configured for use in automatic gain control within the slot.

According to some aspects, data reception circuitry 825 receives a data portion of the first symbol using the first automatic gain control setting. In some examples, data reception circuitry 825 receives a data portion of the second symbol using the second automatic gain control setting.

In some aspects, the first cyclic prefix is an extended cyclic prefix. In some examples, extended cyclic prefix enablement circuitry 830 enables the extended cyclic prefix in order to configure the first automatic gain control setting based on the received power in the first cyclic prefix of the first symbol. In some aspects, the slot includes twelve symbols.

According to some aspects, sidelink transmission circuitry 835 transmits a set of symbols within a sidelink slot, where a PSSCH resource allocation for the sidelink slot begins with a first symbol of the sidelink slot. In some aspects, the first symbol of the sidelink slot and a second symbol of the sidelink slot include different data. In some aspects, the first symbol of the sidelink slot includes PSSCH data and physical sidelink control channel data. In some aspects, the sidelink slot is configured by a starting symbol parameter indicating that the first symbol includes sidelink data. In some aspects, the starting symbol parameter is a startSLsymbols parameter.

Notably, FIG. 8 is just one example, and many other examples and configurations of communication device are possible.

Example Clauses

Implementation examples are described in the following numbered clauses:

Clause 1: A method for wireless communication by a user equipment, the method comprising: receiving a first cyclic prefix of a first symbol within a slot at the user equipment; configuring a first automatic gain control setting based on a received power in the first cyclic prefix of the first symbol; and receiving a data portion of the first symbol using the first automatic gain control setting.

Clause 2: The method of Clause 1, further comprising: receiving a second cyclic prefix of a second symbol within the slot at the user equipment; configuring a second automatic gain control setting based on a received power in the second cyclic prefix of the second symbol; and receiving a data portion of the second symbol using the second automatic gain control setting.

Clause 3: The method of any one of Clauses 1 and 2, wherein the first symbol is the first symbol of the slot.

Clause 4: The method of Clause 3, wherein the first symbol comprises a PSSCH symbol.

Clause 5: The method of any one of Clauses 1-4, wherein the first symbol comprises a physical sidelink feedback channel (PSFCH) symbol and the slot comprises only one PSFCH symbol.

Clause 6: The method of any one of Clauses 1-5, further comprising: transmitting an indication that the user equipment is configured to adjust an automatic gain control setting based on a received power in a cyclic prefix.

Clause 7: The method of any one of Clauses 1-6, wherein the first cyclic prefix is an extended cyclic prefix.

Clause 8: The method of Clause 7, further comprising: enabling the extended cyclic prefix in order to configure the first automatic gain control setting based on the received power in the first cyclic prefix of the first symbol.

Clause 9: The method of Clause 7, wherein the slot comprises twelve symbols.

Clause 10: The method of any one of Clauses 1-9, further comprising: configuring the first automatic gain control setting without receiving a symbol configured for use in automatic gain control within the slot.

Clause 11: A method for wireless communication by a user equipment, the method comprising: transmitting a plurality of symbols within a sidelink slot, wherein a physical sidelink shared channel (PSSCH) resource allocation for the sidelink slot begins with a first symbol of the sidelink slot.

Clause 12: The method of Clause 11, wherein the first symbol of the sidelink slot and a second symbol of the sidelink slot comprise different data.

Clause 13: The method of any one of Clauses 11-12, wherein the first symbol of the sidelink slot comprises PSSCH data and physical sidelink control channel data.

Clause 14: The method of any one of Clauses 11-13, wherein the sidelink slot is configured by a starting symbol parameter indicating that the first symbol comprises sidelink data.

Clause 15: The method of any one of Clauses 11-14, wherein the starting symbol parameter is a startSLsymbols parameter.

Clause 16: A processing system, comprising: a memory comprising computer-executable instructions; one or more processors configured to execute the computer-executable instructions and cause the processing system to perform a method in accordance with any one of Clauses 1-15.

Clause 17: A processing system, comprising means for performing a method in accordance with any one of Clauses 1-15.

Clause 18: A non-transitory computer-readable medium comprising computer-executable instructions that, when executed by one or more processors of a processing system, cause the processing system to perform a method in accordance with any one of Clauses 1-15.

Clause 19: A computer program product embodied on a computer-readable storage medium comprising code for performing a method in accordance with any one of Clauses 1-15.

Additional Wireless Communication Network Considerations

The techniques and methods described herein may be used for various wireless communications networks (or wireless wide area network (WWAN)) and radio access technologies (RATs). While aspects may be described herein using terminology commonly associated with 3G, 4G, and/or 5G (e.g., 5G new radio (NR)) wireless technologies, aspects of the present disclosure may likewise be applicable to other communication systems and standards not explicitly mentioned herein.

5G wireless communication networks may support various advanced wireless communication services, such as enhanced mobile broadband (eMBB), millimeter wave (mmWave), machine type communications (MTC), and/or mission critical targeting ultra-reliable, low-latency communications (URLLC). These services, and others, may include latency and reliability requirements.

Returning to FIG. 1, various aspects of the present disclosure may be performed within the example wireless communication network 100.

In 3GPP, the term "cell" can refer to a coverage area of a NodeB and/or a narrowband subsystem serving this coverage area, depending on the context in which the term is used. In NR systems, the term "cell" and BS, next generation NodeB (gNB or gNodeB), access point (AP), distributed unit (DU), carrier, or transmission reception point may be used interchangeably. A BS may provide communication coverage for a macro cell, a pico cell, a femto cell, and/or other types of cells.

A macro cell may generally cover a relatively large geographic area (e.g., several kilometers in radius) and may allow unrestricted access by UEs with service subscription. A pico cell may cover a relatively small geographic area (e.g., a sports stadium) and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG) and UEs for users in the home). A BS for a macro cell may be referred to as a macro BS. A BS for a pico cell may be referred to as a pico BS. A BS for a femto cell may be referred to as a femto BS, home BS, or a home NodeB.

BSs 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., an S1 interface). BSs 102 configured for 5G (e.g., 5G NR or Next Generation RAN (NG-RAN)) may interface with 5GC 190 through second backhaul links 184. BSs 102 may communicate directly or indirectly (e.g., through the EPC 160 or 5GC 190) with each other over third backhaul links 134 (e.g., X2 interface). Third backhaul links 134 may generally be wired or wireless.

Small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. Small cell 102', employing NR in an unlicensed frequency spectrum, may boost coverage to and/or increase capacity of the access network.

Some base stations, such as BS 180 (e.g., gNB) may operate in a traditional sub-6 GHz spectrum, in millimeter wave (mmWave) frequencies, and/or near mmWave frequencies in communication with the UE 104. When the BS 180 operates in mmWave or near mmWave frequencies, the BS 180 may be referred to as an mmWave base station.

The communication links 120 between BSs 102 and, for example, UEs 104, may be through one or more carriers. For example, BSs 102 and UEs 104 may use spectrum up to Y MHz (e.g., 5, 10, 15, 20, 100, 400, and other MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Wireless communication network 100 further includes a Wi-Fi access point (AP) 150 in communication with Wi-Fi stations (STAs) 152 via communication links 154 in, for example, a 2.4 GHz and/or 5 GHz unlicensed frequency spectrum. When communicating in an unlicensed frequency spectrum, the STAs 152/AP 150 may perform a clear channel assessment (CCA) prior to communicating in order to determine whether the channel is available.

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, 4G (e.g., LTE), or 5G (e.g., NR), to name a few options.

EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. MME 162 may be in communication with a Home Subscriber Server (HSS) 174. MME 162 is the control node that processes the signaling between the UEs 104 and the EPC 160. Generally, MME 162 provides bearer and connection management.

Generally, user Internet protocol (IP) packets are transferred through Serving Gateway 166, which itself is connected to PDN Gateway 172. PDN Gateway 172 provides UE IP address allocation as well as other functions. PDN Gateway 172 and the BM-SC 170 are connected to the IP Services 176, which may include, for example, the Internet, an intranet, an IP Multimedia Subsystem (IMS), a PS Streaming Service, and/or other IP services.

BM-SC 170 may provide functions for MBMS user service provisioning and delivery. BM-SC 170 may serve as an entry point for content provider MBMS transmission, may be used to authorize and initiate MBMS Bearer Services within a public land mobile network (PLMN), and may be used to schedule MBMS transmissions. MBMS Gateway 168 may be used to distribute MBMS traffic to the BSs 102 belonging to a Multicast Broadcast Single Frequency Network (MBSFN) area broadcasting a particular service, and may be responsible for session management (start/stop) and for collecting eMBMS related charging information.

5GC 190 may include an Access and Mobility Management Function (AMF) 192, other AMFs 193, a Session Management Function (SMF) 194, and a User Plane Function (UPF) 195. AMF 192 may be in communication with a Unified Data Management (UDM) 196.

AMF 192 is generally the control node that processes the signaling between UEs 104 and 5GC 190. Generally, AMF 192 provides QoS flow and session management.

All user Internet protocol (IP) packets are transferred through UPF 195, which is connected to the IP Services 197, and which provides UE IP address allocation as well as other functions for 5GC 190. IP Services 197 may include, for example, the Internet, an intranet, an IP Multimedia Subsystem (IMS), a PS Streaming Service, and/or other IP services.

Returning to FIG. 2, various example components of BS 102 and UE 104 (e.g., the wireless communication network 100 of FIG. 1) are depicted, which may be used to implement aspects of the present disclosure.

At BS 102, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), and others. The data may be for the physical downlink shared channel (PDSCH), in some examples.

A medium access control (MAC)-control element (MAC-CE) is a MAC layer communication structure that may be used for control command exchange between wireless nodes. The MAC-CE may be carried in a shared channel such as a physical downlink shared channel (PDSCH), a physical uplink shared channel (PUSCH), or a physical sidelink shared channel (PSSCH).

Transmit processor 220 may process (e.g., encode and symbol map) the data and control information to obtain data symbols and control symbols, respectively. Transmit processor 220 may also generate reference symbols, such as for the primary synchronization signal (PSS), secondary synchronization signal (SSS), PBCH demodulation reference signal (DMRS), and channel state information reference signal (CSI-RS).

Transmit (TX) multiple-input multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for OFDM) to obtain an output sample stream. Each modulator may further process (e.g., convert to analog, amplify, filter, and upconvert) the output sample stream to obtain a downlink signal. Downlink signals from the modulators in transceivers 232a-232t may be transmitted via the antennas 234a-234t, respectively.

At UE 104, antennas 252a-252r may receive the downlink signals from the BS 102 and may provide received signals to the demodulators (DEMODs) in transceivers 254a-254r, respectively. Each demodulator in transceivers 254a-254r may condition (e.g., filter, amplify, downconvert, and digitize) a respective received signal to obtain input samples. Each demodulator may further process the input samples (e.g., for OFDM) to obtain received symbols.

MIMO detector 256 may obtain received symbols from all the demodulators in transceivers 254a-254r, perform MIMO detection on the received symbols if applicable, and provide detected symbols. Receive processor 258 may process (e.g., demodulate, deinterleave, and decode) the detected symbols, provide decoded data for the UE 104 to a data sink 260, and provide decoded control information to a controller/processor 280.

On the uplink, at UE 104, transmit processor 264 may receive and process data (e.g., for the physical uplink shared channel (PUSCH)) from a data source 262 and control information (e.g., for the physical uplink control channel (PUCCH) from the controller/processor 280. Transmit processor 264 may also generate reference symbols for a reference signal (e.g., for the sounding reference signal (SRS)). The symbols from the transmit processor 264 may be precoded by a TX MIMO processor 266 if applicable, further processed by the modulators in transceivers 254a-254r (e.g., for SC-FDM), and transmitted to BS 102.

At BS 102, the uplink signals from UE 104 may be received by antennas 234a-t, processed by the demodulators in transceivers 232a-232t, detected by a MIMO detector 236 if applicable, and further processed by a receive processor 238 to obtain decoded data and control information sent by UE 104. Receive processor 238 may provide the decoded data to a data sink 239 and the decoded control information to the controller/processor 240.

Memories 242 and 282 may store data and program codes for BS 102 and UE 104, respectively.

Scheduler 244 may schedule UEs for data transmission on the downlink and/or uplink.

5G may utilize orthogonal frequency division multiplexing (OFDM) with a cyclic prefix (CP) on the uplink and downlink. 5G may also support half-duplex operation using time division duplexing (TDD). OFDM and single-carrier frequency division multiplexing (SC-FDM) partition the system bandwidth into multiple orthogonal subcarriers, which are also commonly referred to as tones and bins. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The minimum resource allocation, called a resource block (RB), may be 12 consecutive subcarriers in some examples. The system bandwidth may also be partitioned into subbands. For example, a subband may cover multiple RBs. NR may support a base subcarrier spacing (SCS) of 15 KHz and other SCS may be defined with respect to the base SCS (e.g., 30 kHz, 60 kHz, 120 kHz, 240 kHz, and others).

As above, FIGS. 3A, 3B, 3C, and 3D depict various example aspects of data structures for a wireless communication network, such as wireless communication network 100 of FIG. 1.

In various aspects, the 5G frame structure may be frequency division duplex (FDD), in which for a particular set of subcarriers (carrier system bandwidth), subframes within the set of subcarriers are dedicated for either DL or UL. 5G frame structures may also be time division duplex (TDD), in which for a particular set of subcarriers (carrier system bandwidth), subframes within the set of subcarriers are dedicated for both DL and UL. In the examples provided by FIGS. 3A and 3C, the 5G frame structure is assumed to be TDD, with subframe 4 being configured with slot format 28 (with mostly DL), where D is DL, U is UL, and X is flexible for use between DL/UL, and subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description below applies also to a 5G frame structure that is TDD.

Other wireless communication technologies may have a different frame structure and/or different channels. A frame (10 ms) may be divided into 10 equally sized subframes (1 ms). Each subframe may include one or more time slots. Subframes may also include mini-slots, which may include 7, 4, or 2 symbols. In some examples, each slot may include 7 or 14 symbols, depending on the slot configuration.

For example, for slot configuration 0, each slot may include 14 symbols, and for slot configuration 1, each slot may include 7 symbols. The symbols on DL may be cyclic prefix (CP) OFDM (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission).

The number of slots within a subframe is based on the slot configuration and the numerology. For slot configuration 0, different numerologies 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology μ, there are 14 symbols/slot and 2 μ slots/subframe. The subcarrier spacing and symbol length/duration are a function of the numerology. The subcarrier spacing may be equal to $2^\mu \times 15$ kHz, where μ is the numerology 0 to 5. As such, the numerology μ=0 has a subcarrier spacing of 15 kHz and the numerology μ=5 has a subcarrier spacing of 480 kHz. The symbol length/duration is inversely related to the subcarrier spacing. FIGS. 3A, 3B, 3C, and 3D provide an example of slot configuration 0 with 14 symbols per slot and numerology μ=2 with 4 slots per subframe. The slot duration is 0.25 ms, the subcarrier spacing is 60 kHz, and the symbol duration is approximately 16.67 μs.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 3A, some of the REs carry reference (pilot) signals (RS) for a UE (e.g., UE 104 of FIGS. 1 and 2). The RS may include demodulation RS (DM-RS) (indicated as Rx for one particular configuration, where 100x is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 3B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol.

A primary synchronization signal (PSS) may be within symbol 2 of particular subframes of a frame. The PSS is used by a UE (e.g., 104 of FIGS. 1 and 2) to determine subframe/symbol timing and a physical layer identity.

A secondary synchronization signal (SSS) may be within symbol 4 of particular subframes of a frame. The SSS is used by a UE to determine a physical layer cell identity group number and radio frame timing.

Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 3C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 3D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Additional Considerations

The preceding description provides examples of configuring sidelink slots without symbols for automatic gain control in communication systems. The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The techniques described herein may be used for various wireless communication technologies, such as 5G (e.g., 5G NR), 3GPP Long Term Evolution (LTE), LTE-Advanced (LTE-A), code division multiple access (CDMA), time division multiple access (TDMA), frequency division multiple access (FDMA), orthogonal frequency division multiple access (OFDMA), single-carrier frequency division multiple access (SC-FDMA), time division synchronous code division multiple access (TD-SCDMA), and other networks. The terms "network" and "system" are often used interchangeably. A CDMA network may implement a radio technology such as Universal Terrestrial Radio Access (UTRA), cdma2000, and others. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, and others. UTRA and E-UTRA are part of Universal Mobile Telecommunication System (UMTS). LTE and LTE-A are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). NR is an emerging wireless communications technology under development.

The various illustrative logical blocks, modules and circuits described in connection with the present disclosure may be implemented or performed with a general purpose processor, a DSP, an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user equipment (as in the example UE 104 of FIG. 1), a user interface (e.g., keypad, display, mouse, joystick, touchscreen, biometric sensor, proximity sensor, light emitting element, and others) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor.

Generally, where there are operations illustrated in figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for wireless communication by a user equipment, the method comprising:
    determining a slot format for a slot at the user equipment based on a settling time required for an automatic gain control;
    receiving a first cyclic prefix of a first symbol within the slot at the user equipment;
    configuring a first automatic gain control setting based on a received power in the first cyclic prefix of the first symbol; and
    receiving a data portion of the first symbol using the first automatic gain control setting.

2. The method of claim 1, further comprising:
    receiving a second cyclic prefix of a second symbol within the slot at the user equipment;
    configuring a second automatic gain control setting based on a received power in the second cyclic prefix of the second symbol; and
    receiving a data portion of the second symbol using the second automatic gain control setting.

3. The method of claim 2, wherein the first symbol comprises a physical sidelink shared channel (PSSCH) symbol.

4. The method of claim 1, wherein the first symbol is the first symbol of the slot.

5. The method of claim 1, wherein the first symbol comprises a physical sidelink feedback channel (PSFCH) symbol and the slot comprises only one PSFCH symbol.

6. The method of claim 1, wherein the user equipment is configured to adjust an automatic gain control setting based on a received power in a cyclic prefix.

7. The method of claim 6, wherein the slot comprises twelve symbols.

8. The method of claim 1, wherein the first cyclic prefix is an extended cyclic prefix.

9. The method of claim 8, further comprising enabling the extended cyclic prefix in order to configure the first automatic gain control setting based on the received power in the first cyclic prefix of the first symbol.

10. The method of claim 1, wherein configuring a first automatic gain control setting based on a received power in the first cyclic prefix comprises configuring the first automatic gain control setting without receiving a symbol configured for use in automatic gain control within the slot.

11. A user equipment configured for wireless communication, comprising:
    a memory comprising instructions; and
    one or more processors configured to execute the instructions and cause the user equipment to:
        determine a slot format for a slot at the user equipment based on a settling time required for an automatic gain control;
        receive a first cyclic prefix of a first symbol within the slot at a user equipment;
        configure a first automatic gain control setting based on a received power in the first cyclic prefix of the first symbol; and
        receive a data portion of the first symbol using the first automatic gain control setting.

12. The user equipment of claim 11, wherein the one or more processors are further configured to execute the instructions and cause the user equipment to:
    receive a second cyclic prefix of a second symbol within the slot at the user equipment;
    configure a second automatic gain control setting based on a received power in the second cyclic prefix of the second symbol; and
    receive a data portion of the second symbol using the second automatic gain control setting.

13. The user equipment of claim 11, wherein the first symbol is the first symbol of the slot.

14. The user equipment of claim 13, wherein the first symbol comprises a physical sidelink shared channel (PSSCH) symbol.

15. The user equipment of claim 11, wherein the first symbol comprises a physical sidelink feedback channel (PSFCH) symbol and the slot comprises only one PSFCH symbol.

16. The user equipment of claim 11, wherein the user equipment is configured to adjust an automatic gain control setting based on a received power in a cyclic prefix.

17. The user equipment of claim 11, wherein the first cyclic prefix is an extended cyclic prefix.

18. The user equipment of claim 17, wherein the one or more processors are further configured to execute the instructions and cause the user equipment to enable the extended cyclic prefix in order to configure the first automatic gain control setting based on the received power in the first cyclic prefix of the first symbol.

19. The user equipment of claim 17, wherein the slot comprises twelve symbols.

20. The user equipment of claim 11, wherein in order to configure a first automatic gain control setting based on a received power in the first cyclic prefix of the first symbol, the one or more processors are further configured to execute the instructions and cause the user equipment to configure the first automatic gain control setting without receiving a symbol configured for use in automatic gain control within the slot.

21. A non-transitory computer-readable medium comprising instructions that, when executed by one or more processors of a user equipment, cause the user equipment to perform a method of wireless communication, comprising:
    determining a slot format for a slot at the user equipment based on a settling time required for an automatic gain control;
    receiving a first cyclic prefix of a first symbol within the slot at the user equipment;
    configuring a first automatic gain control setting based on a received power in the first cyclic prefix of the first symbol; and receiving a data portion of the first symbol using the first automatic gain control setting.

22. The non-transitory computer-readable medium of claim 21, wherein the method of wireless communication further comprises:
receiving a second cyclic prefix of a second symbol within the slot at the user equipment;
configuring a second automatic gain control setting based on a received power in the second cyclic prefix of the second symbol; and
receiving a data portion of the second symbol using the second automatic gain control setting.

23. The non-transitory computer-readable medium of claim 21, wherein the user equipment is configured to adjust an automatic gain control setting based on a received power in a cyclic prefix.

24. The non-transitory computer-readable medium of claim 23, wherein:
the first cyclic prefix is an extended cyclic prefix, and
the method of wireless communication further comprises enabling the extended cyclic prefix in order to configure the first automatic gain control setting based on the received power in the first cyclic prefix of the first symbol.

25. The non-transitory computer-readable medium of claim 21, wherein the method of wireless communication further comprises configuring the first automatic gain control setting without receiving a symbol configured for use in automatic gain control within the slot.

26. An apparatus for wireless communication at a user equipment, comprising:
a memory comprising instructions; and
one or more processors configured to execute the instructions and cause the apparatus to:
determine a slot format for a slot at the user equipment based on a settling time required for an automatic gain control;
receive a first cyclic prefix of a first symbol within the slot at the user equipment;
configure a first automatic gain control setting based on a received power in the first cyclic prefix of the first symbol; and
receive a data portion of the first symbol using the first automatic gain control setting.

27. The apparatus of claim 26, wherein the one or more processors are configured to execute the instructions and cause the apparatus to:
receive a second cyclic prefix of a second symbol within the slot at the user equipment;
configure a second automatic gain control setting based on a received power in the second cyclic prefix of the second symbol; and
receive a data portion of the second symbol using the second automatic gain control setting.

28. The apparatus of claim 27, wherein the first symbol comprises a physical sidelink shared channel (PSSCH) symbol.

29. The apparatus of claim 26, wherein the first symbol is the first symbol of the slot.

30. The apparatus of claim 26, wherein the first symbol comprises a physical sidelink feedback channel (PSFCH) symbol and the slot comprises only one PSFCH symbol.

* * * * *